(12) United States Patent
Kim

(10) Patent No.: US 7,858,477 B2
(45) Date of Patent: Dec. 28, 2010

(54) FORMING A BURIED BIT LINE IN A BULB-SHAPED TRENCH

(75) Inventor: Han Nae Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 210 days.

(21) Appl. No.: 12/117,429

(22) Filed: May 8, 2008

(65) Prior Publication Data
US 2009/0230466 A1 Sep. 17, 2009

(30) Foreign Application Priority Data
Mar. 13, 2008 (KR) ...................... 10-2008-0023445

(51) Int. Cl.
*H01L 21/336* (2006.01)
(52) U.S. Cl. ...................... 438/270; 438/701; 257/331; 257/E21.658; 257/E29.257
(58) Field of Classification Search ................ 438/270
See application file for complete search history.

(56) References Cited

U.S. PATENT DOCUMENTS 7,368,352 B2 * 5/2008 Kim et al. .................. 438/268

| 2005/0054158 A1* | 3/2005 | Divakaruni et al. | 438/246 |
| 2007/0012996 A1* | 1/2007 | Yoon et al. | 257/329 |
| 2007/0080385 A1* | 4/2007 | Kim et al. | 257/296 |
| 2007/0082448 A1* | 4/2007 | Kim et al. | 438/268 |
| 2007/0181925 A1* | 8/2007 | Yoon et al. | 257/296 |
| 2009/0256194 A1* | 10/2009 | Kim et al. | 257/330 |
| 2010/0096693 A1* | 4/2010 | Hong | 257/331 |

FOREIGN PATENT DOCUMENTS

KR 100660881 12/2006
KR 10-2007-0009140 1/2007

* cited by examiner

*Primary Examiner*—Wael M Fahmy
*Assistant Examiner*—Abul Kalam
(74) *Attorney, Agent, or Firm*—Marshall, Gerstein & Borun LLP

(57) ABSTRACT

A method for manufacturing a semiconductor device includes forming a bulb-type trench separated from a surrounding gate and forming a buried bit line in the bulb-type trench, thereby preventing electric short of a word line and the buried bit line. A semiconductor device includes a vertical pillar formed over a semiconductor substrate, a surrounding gate formed outside the vertical pillar, and a buried bit line separated from the surrounding gate.

9 Claims, 3 Drawing Sheets

FORMING A BURIED BIT LINE IN A BULB-SHAPED TRENCH

CROSS-REFERENCE TO RELATED APPLICATION

The priority of Korean patent application number 10-2008-23445, filed on Mar. 13, 2008, which is incorporated by reference in its entirety, is claimed.

BACKGROUND OF THE INVENTION

The present invention generally relates to a semiconductor device and a method for manufacturing the same, and more specifically, to a technology of forming a buried bit line separated from a surrounding gate with a given distance to prevent electric short of a word line and the buried bit line.

A semiconductor device such as a DRAM requires a technique of including more transistors in a limited region to improve integration. So, a vertical transistor technique of including memory cells in a small area is suggested. In the case of a memory device, a vertical transistor has a surrounding gate structure that surrounds a vertical channel.

In order to form a surrounding gate structure or electrode in 4F2, a channel region is selectively isotropic-etched so that the channel region becomes thinner than source/drain regions to obtain excellent device characteristics. The vertical transistor may use a limited area effectively. Meanwhile, the vertical transistor is expected to have a smaller size, so that the vertical transistor has been spotlighted as well as the DRAM.

In general, a method for manufacturing a vertical transistor includes etching a semiconductor substrate by a photo-etching process with a mask that defines an active region to form a vertical pillar, forming a surrounding gate that surrounds the vertical pillar, and forming a buried bit line in the bottom of the surround gate. The buried bit line is obtained by ion-implantation into the semiconductor substrate between the surrounding gates. The surrounding gate is formed adjacent to the buried bit line.

In a damascene word line process for electric connection of the surrounding gates, an etching process is performed with an exact etching target so that a damascene word line may be formed higher than the bottom portion of the surrounding gate.

However, it is difficult to adjust the etching target with excessive etching during the damascene word line process potentially causing an electric short between the buried bit line and a word line formed by a subsequent process.

BRIEF SUMMARY OF THE INVENTION

Various embodiments of the present invention are directed at a method for manufacturing a semiconductor device that comprises forming a buried bit line separated from a surrounding gate with a given interval to prevent an electric short between the buried bit line and a word line.

According to an embodiment of the present invention, a semiconductor device comprises a vertical pillar formed over a semiconductor substrate, a surrounding gate formed outside the vertical pillar, and a buried bit line separated from the surrounding gate.

The buried bit line is separated from the bottom portion of the surrounding gate by 500 Å to 2000 Å. The buried bit line includes a doped polysilicon layer.

According to an embodiment of the present invention, a method for manufacturing a semiconductor device may include forming a vertical pillar over a semiconductor substrate; forming a surrounding gate outside the vertical pillar; etching the semiconductor substrate between the surrounding gates to form a trench; etching the bottom portion of the trench to form a bulb-type trench; forming a bit line material film in the bulb-type trench; and etching the bit line material film and the semiconductor substrate to form a separate buried bit line.

The forming-a-vertical-pillar may include forming a pad oxide film and a hard mask pattern over the semiconductor substrate; etching the pad oxide film and the semiconductor substrate with the hard mask pattern as an etching mask to form a first vertical pillar expected to be a source/drain region; forming a first spacer at sidewalls of the first vertical pillar, the pad oxide film and the hard mask pattern; etching the semiconductor substrate with the first vertical pillar and the first spacer as an etching mask to form a second vertical pillar; and isotropic-etching the second vertical pillar to form a third vertical pillar expected to be a channel region.

The forming-a-surrounding-gate may include forming a gate insulating film over the third vertical pillar; forming a conductive layer over the gate insulating film and the first and third vertical pillars; and etching the conductive layer with the hard mask pattern as an etching mask. The forming-a-vertical-pillar may further include forming a second spacer at the surrounding gate and the sidewall of the first spacer.

The forming-a-trench may include forming an insulating film over the vertical pillar and the surrounding gate; forming a photoresist pattern over the insulating film to expose an interval between the vertical pillars; etching the insulating film and the semiconductor substrate with the photoresist pattern as an etching mask; and removing the photoresist pattern.

The trench may be formed to have a depth ranging from 500 Å to 2000 Å from the bottom portion of the surrounding gate. The forming-a-bulb-type-trench is performed by an isotropic-etching method. The bit line material film includes a doped polysilicon layer.

After forming a buried bit line, the method may further include forming a first insulating film over the semiconductor substrate, the buried bit line, the surrounding gate and the vertical pillar; forming a second insulating film over the first insulating film to bury an interval between the vertical pillars; selectively etching the second insulating film to expose the first insulating film disposed at the sidewall of the surrounding gate; removing the first insulating film; forming a conductive film over the second insulating film; and selectively etching the conductive film to form a word line that connects the surrounding gate.

DESCRIPTION OF EMBODIMENTS

FIGS. 1a to 1f are cross-sectional diagrams illustrating a method for manufacturing a semiconductor device according to an embodiment of the present invention.

Figure 1A:
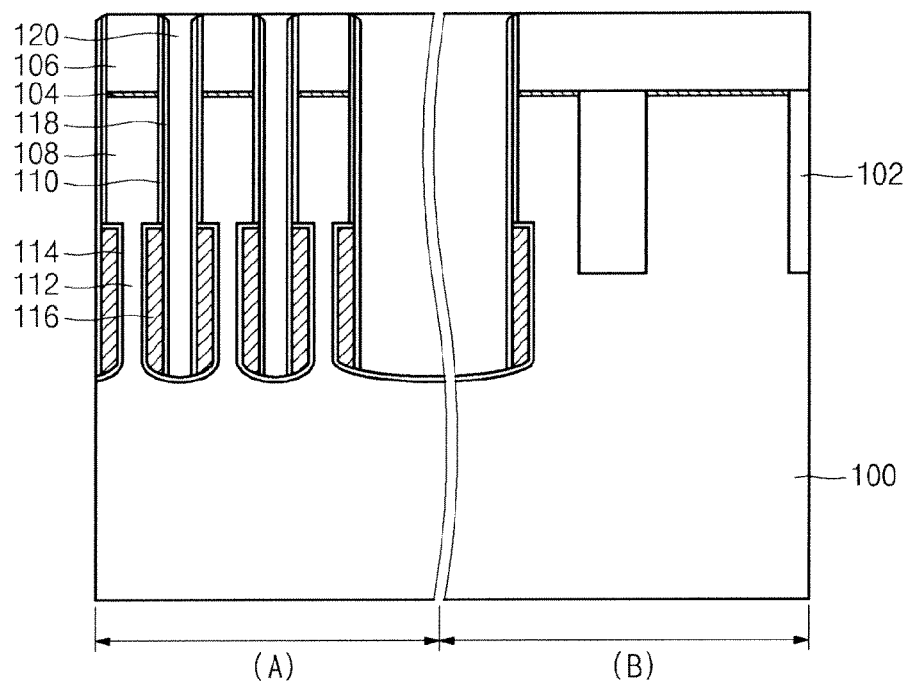
FIGS. 1a to 1f are cross-sectional diagrams illustrating a method for manufacturing a semiconductor device according to an embodiment of the present invention.

Referring to FIG. 1a, a device isolating film 102 is formed in a cell region (A) and a peripheral circuit region (B) of a semiconductor substrate 100. The device isolating film 102 may be formed by a shallow trench isolation (STI) process.

A pad oxide film 104 and a hard mask layer (not shown) are formed over the semiconductor substrate 100 including the device isolating film 102. The hard mask layer of the cell region (A) is etched by a photo-etching process with a mask that defines an active region to form a hard mask pattern 106.

The pad oxide film 104 and a part of the semiconductor substrate 100 are etched with the hard mask pattern 106 as an etching mask to form a first vertical pillar 108 expected to be source/drain regions.

A first insulating film (not shown) is formed on the semiconductor substrate 100, the first vertical pillar 108 and the hard mask pattern 106. The first insulating film is blanket-etched to form a first spacer 110 at sidewalls of the first vertical pillar 108, the pad oxide film 104 and the hard mask pattern 106.

A part of the semiconductor substrate 100 exposed by the first vertical pillar 108 is selectively etched with the hard mask pattern 106 and the first spacer 110 as an etching mask, to form a second vertical pillar (not shown) extended to the bottom portion of the first vertical pillar 108. A depth of the second vertical pillar is adjusted by a size of a surrounding gate 116.

An isotropic-etching process is performed on the semiconductor substrate 100 to etch a part of the second vertical pillar. As a result, a third vertical pillar 112 expected to be a channel region is formed to have a smaller critical dimension than that of the first vertical pillar 108.

A gate insulating film 114 is formed on the semiconductor substrate 100 and the third vertical pillar 112 exposed in the bottom of the first vertical pillar 108. A first conductive layer (not shown) is formed over the gate insulating film 114, the first and third vertical pillars 108 and 112 to bury an interval between the first and third vertical pillars 108 and 112.

The first conductive layer is etched with the hard mask pattern 106 and the first spacer 110 as an etching mask to form a surrounding gate 116 that surrounds the third vertical pillar 112.

A second insulating film (not shown) is formed over the semiconductor substrate 100, the surrounding gate 116, the first spacer 110 and the hard mask pattern 106. The second insulating film is selectively etched to form a second spacer 118 at the surrounding gate 116 and a sidewall of the first spacer 110.

A third insulating film 120 is formed over the semiconductor substrate 100, the second spacer 118 and the hard mask pattern 106. The third insulating film 120 is planarized until the hard mask pattern 106 is exposed to bury an interval between the surrounding gates 116.

Figure 1B:
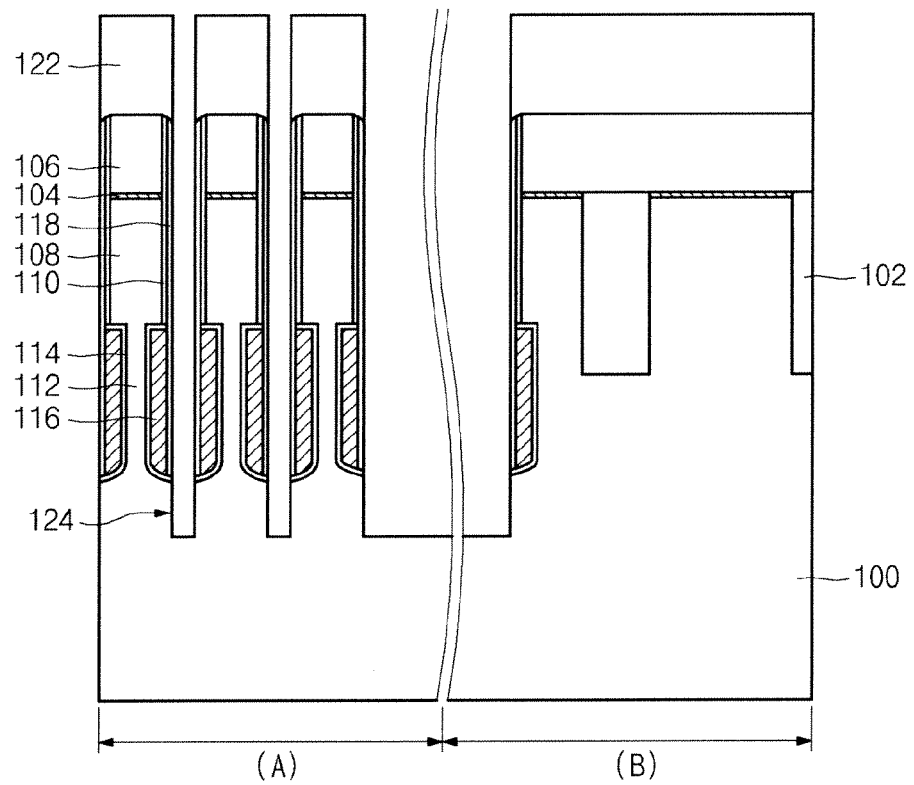

Referring to FIG. 1b, a photoresist pattern 122 that exposes the semiconductor substrate 100 between the second spacers 118 is formed over the third insulating film 120. The third insulating film 120 and a part of the semiconductor substrate 100 disposed in the bottom portion of the third insulating film 120 are etched with the photoresist pattern 122 and the second spacer 118 as an etching mask, thereby forming a trench 124.

A depth of the trench 124 may be adjusted depending on a distance between the surrounding gate 116 and a buried bit line to be formed in a subsequent process. The trench 124 is formed to have a depth ranging from about 500 Å to about 2000 Å from the bottom portion of the surrounding gate 116.

Figure 1C:
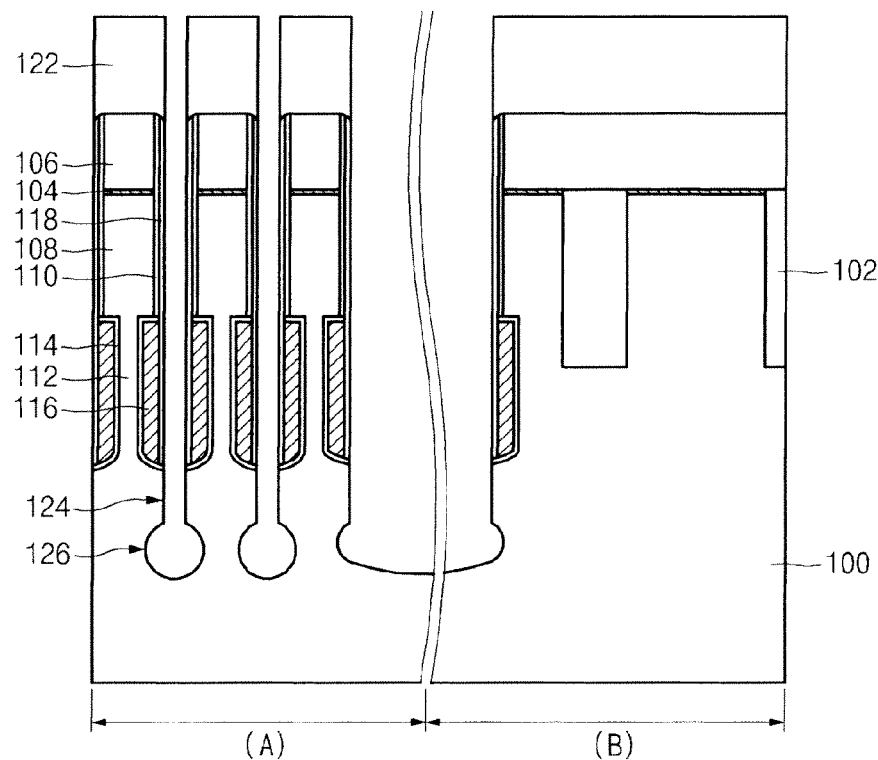

Referring to FIG. 1c, the semiconductor substrate 100 disposed at the bottom portion of the trench 124 is etched to form a bulb-type trench 126. The etching process of the semiconductor substrate 100 is performed by an isotropic-etching method.

Figure 1D:
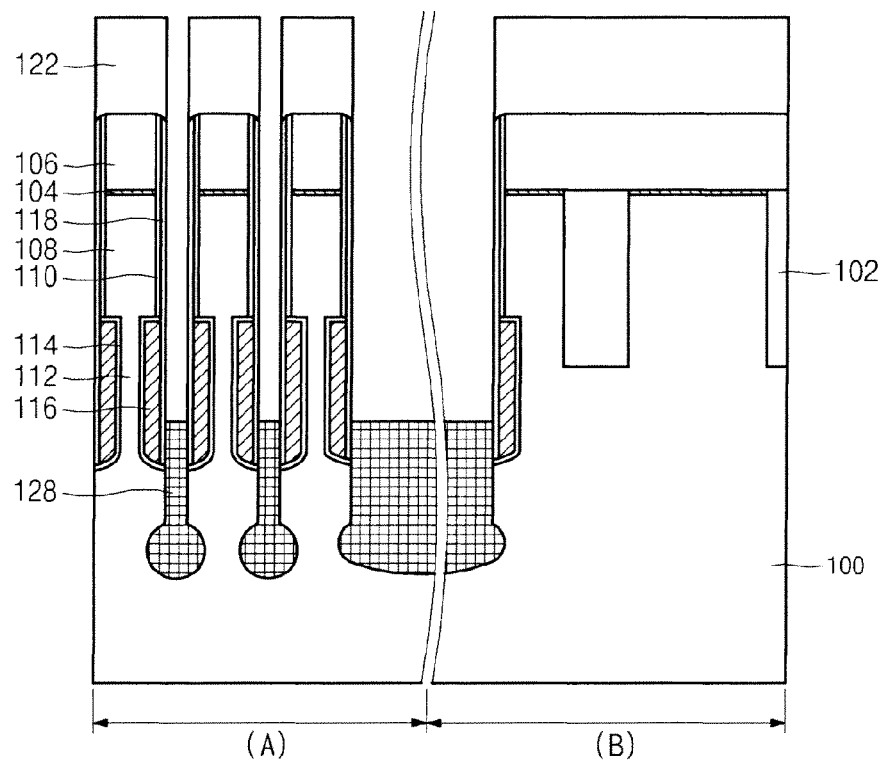

Referring to FIG. 1d, a bit line material film 128 for burying the bulb-type trench 126 and the trench 124 is formed. The bit line material film 128 may include a doped polysilicon layer.

The bit line material film 128 is selectively etched so that the bit line material film 128 may remain in a part of the trench 124 and the bulb-type trench 126. The selective etching process of the bit line material film 128 is performed by an etch-back method.

Figure 1E:
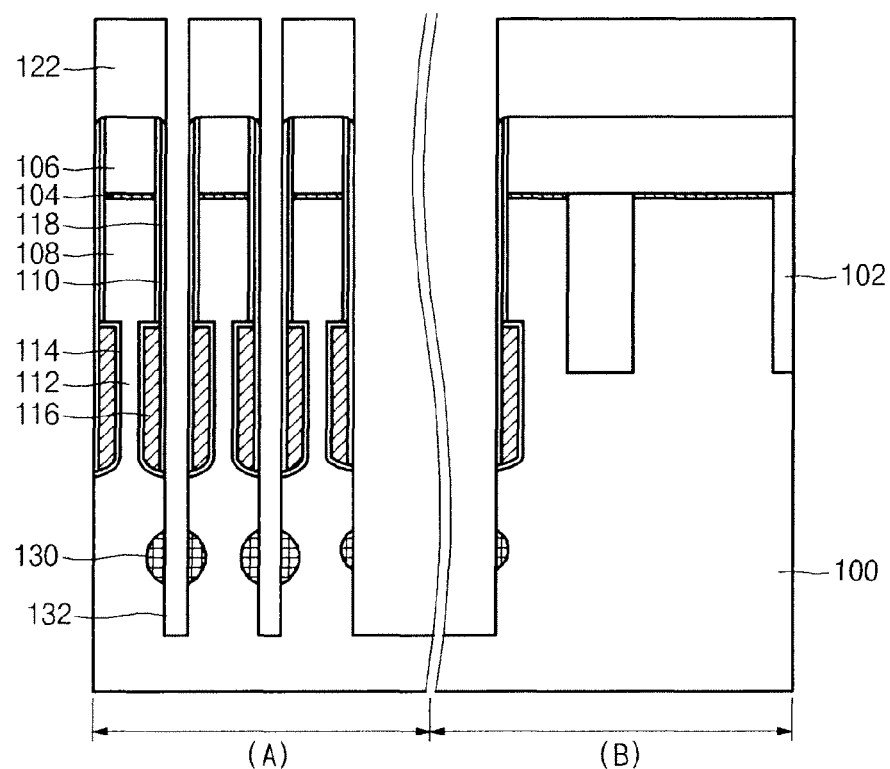

Referring to FIG. 1e, the bit line material film 128 and a part of the semiconductor substrate 100 disposed in the bottom of the bit line material film 128 are etched with the photoresist pattern 122 and the second spacer 118 as an etching mask to form a buried bit line 130. The photoresist pattern 122 is removed.

Figure 1F:
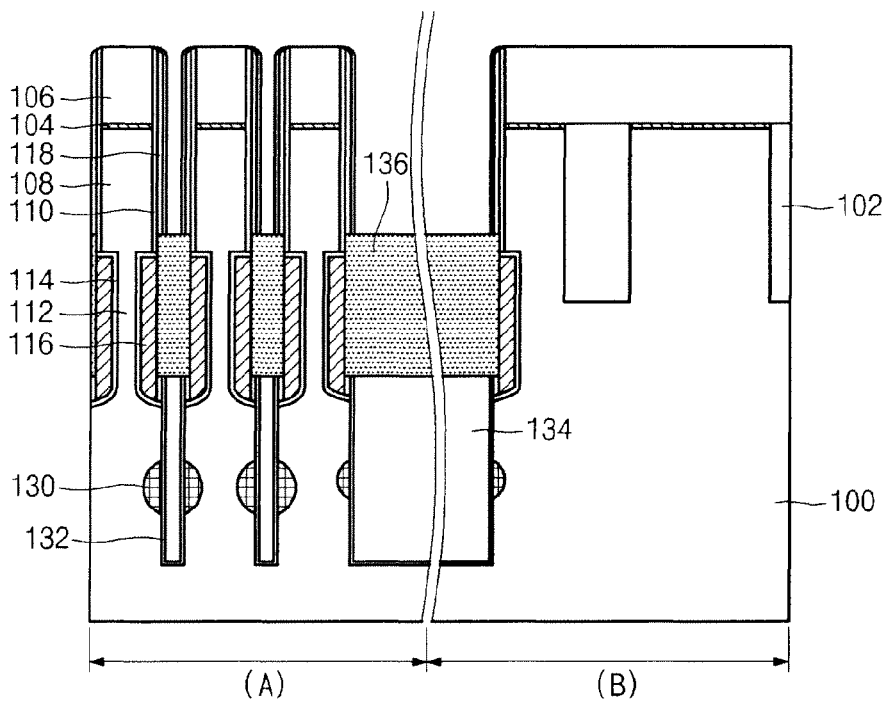

Referring to FIG. 1f, a fourth insulating film 132 is formed over the semiconductor substrate 100, the buried bit line 130, the second spacer 118 and the hard mask pattern 106.

A fifth insulating film 134 is formed over the fourth insulating film 132. The fifth insulating film 134 is selectively etched to expose a part of the surrounding gate 116. The fourth insulating film 132 over the surrounding gate 116 is removed.

A conductive film (not shown) is formed over the fifth insulating film 134. The conductive film is selectively etched to form a word line 136 that connects the surrounding gate 116.

As described above, according to an embodiment of the present invention, a method for manufacturing a semiconductor device may include forming a bulb-type trench separated from a surrounding gate with a given interval and forming a buried bit line in the bulb-type trench to prevent electric short between the buried bit line and a word line.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a vertical pillar over a semiconductor substrate;
   forming a surrounding gate outside the vertical pillar;
   etching the semiconductor substrate between the surrounding gates to form a trench;
   etching the bottom portion of the trench to form a bulb-type trench;
   forming a bit line material film in the bulb-type trench; and
   etching the bit line material film and the semiconductor substrate to form a separate buried bit line.

2. The method according to claim 1, wherein forming-a-vertical-pillar includes:
   forming a pad oxide film and a hard mask pattern over the semiconductor substrate;
   etching the pad oxide film and the semiconductor substrate with the hard mask pattern as an etching mask to form a first vertical pillar expected to be a source/drain region;
   forming a first spacer at sidewalls of the first vertical pillar, the pad oxide film and the hard mask pattern;
   etching the semiconductor substrate with the first vertical pillar and the first spacer as an etching mask to form a second vertical pillar; and
   isotropically etching the second vertical pillar to form a third vertical pillar expected to be a channel region.

3. The method according to claim 2, wherein forming-a-surrounding-gate includes:
- forming a gate insulating film on the third vertical pillar;
- forming a conductive layer over the gate insulating film and the first and third vertical pillars; and
- etching the conductive layer with the hard mask pattern as an etching mask.

4. The method according to claim 2, further comprising forming a second spacer at the surrounding gate and the sidewall of the first spacer.

5. The method according to claim 1, wherein forming-a-trench includes:
- forming an insulating film on the vertical pillar and the surrounding gate;
- forming a photoresist pattern over the insulating film to expose an interval between the vertical pillars;
- etching the insulating film and the semiconductor substrate with the photoresist pattern as an etching mask; and
- removing the photoresist pattern.

6. The method according to claim 1, wherein the trench is formed to have a depth ranging from about 500 Å to about 2000 Å from the bottom portion of the surrounding gate.

7. The method according to claim 1, wherein forming-a-bulb-type-trench comprising isotropic-etching.

8. The method according to claim 1, wherein the bit line material film includes a doped polysilicon layer.

9. The method according to claim 1, further comprising after forming a buried bit line:
- forming a first insulating film on the semiconductor substrate, the buried bit line, the surrounding gate and the vertical pillar;
- forming a second insulating film over the first insulating film to bury an interval between the vertical pillars;
- etching the second insulating film to expose the first insulating film disposed at the sidewall of the surrounding gate;
- removing the first insulating film;
- forming a conductive film over the second insulating film; and
- etching the conductive film to form a word line that connects the surrounding gate.

* * * * *